United States Patent [19]
Li et al.

[11] Patent Number: 5,663,637
[45] Date of Patent: Sep. 2, 1997

[54] ROTARY SIGNAL COUPLING FOR CHEMICAL MECHANICAL POLISHING ENDPOINT DETECTION WITH A WESTECH TOOL

[75] Inventors: Leping Li, Poughkeepsie; Steven George Barbee, Dover Plains, both of N.Y.; Gary Richard Doyle, Jonesville, Vt.; Arnold Halperin, Cortlandt Manor; Kevin L. Holland, Newburgh, both of N.Y.; Francis Walter Kazak, Essex Junction, Vt.; Robert B. Lipori, Stamford, Conn.; Anne Elizabeth McGuire, Colchester; Rock Nadeau, Essex Junction, both of Vt.; William Joseph Surovic, Carmel, N.Y.

[73] Assignee: International Business Machines Corporation, Armonk, N.Y.

[21] Appl. No.: 620,720

[22] Filed: Mar. 19, 1996

[51] Int. Cl.[6] .................................................. G01R 27/00
[52] U.S. Cl. ........................................ 324/71.5; 324/671
[58] Field of Search ................................ 324/71.5, 671, 324/765, 228, 229, 230, 239, 262, 654, 758

[56] References Cited

U.S. PATENT DOCUMENTS

| | | | |
|---|---|---|---|
| 4,433,510 | 2/1984 | Katagiri | 324/229 |
| 4,715,007 | 12/1987 | Fujita | 324/230 |
| 5,559,428 | 9/1996 | Li | 324/71.5 |

Primary Examiner—Christine K. Oda
Attorney, Agent, or Firm—Alison D. Mortinger

[57] ABSTRACT

Rotary signal coupling in in-situ monitoring of a chemical-mechanical polishing process. A sensor fixed to a rotatable wafer carrier for creating a signal responsive to the chemical mechanical polishing process is coupled to a bottom half of a rotary transformer fixed to a rotating portion of the polisher. A top half of the rotary transformer, coupled to the bottom half of the rotary transformer, is fixed to a stationary portion of the polisher. The signal from the sensor is thus coupled through the rotary transformer to a process monitor.

22 Claims, 6 Drawing Sheets

ROTARY SIGNAL COUPLING FOR CHEMICAL MECHANICAL POLISHING ENDPOINT DETECTION WITH A WESTECH TOOL

FIELD OF THE INVENTION

This invention is directed to in-situ endpoint detection for chemical mechanical polishing of semiconductor wafers, and more particularly to the signal transfer from a rotating portion of a wafer carrier to a stationary portion of the carrier.

BACKGROUND OF THE INVENTION

In the semiconductor industry, chemical mechanical polishing (CMP) is used to selectively remove portions of a film from a semiconductor wafer by rotating the wafer against a polishing pad on a platen (or rotating the pad against the wafer, or both) with a controlled amount of pressure in the presence of a chemically reactive slurry. Overpolishing (removing too much) or underpolishing (removing too little) of a film results in scrapping or rework of the wafer, which can be very expensive. Various methods have been employed to detect when the desired endpoint for removal has been reached, and the polishing should be stopped. One such method described in copending patent application Ser. No. 08/419,206, Pat. No. 5,559,428, uses a sensor which can be located near the back of the wafer during the polishing process. As the polishing process proceeds, the sensor generates a signal corresponding to the film thickness, and indicates when polishing should be stopped.

IPEC/Westech of Phoenix, AZ manufactures a Westech chemical mechanical polishing apparatus (polisher) that is commonly used in the semiconductor industry. The part of the Westech polisher that holds the wafer and rotates it (upside down) against a polishing pad as shown in FIG. 1 includes a bottom plate 100, a carrier drive ring 102, a T-bar 104, and a carrier cover 106. A wafer to be polished is held upside down against the bottom side 101 of bottom plate 100 by a vacuum created using an insert film (hereafter called insert pad) with holes (not shown). The entire assembly rotates and is held by a robot arm of the polisher (not shown) connected through opening 108 to T-bar 104.

When using the sensor of copending application Ser. No. 08/419,206 filed Apr. 10, 1995 entitled "In-Situ Monitoring of the Change in Thickness of Films" assigned to the present assignee with the Westech polisher, positioning it near the back of the wafer necessitates locating it somewhere in the wafer carrier. This creates several problems. First, a rotary means of signal coupling is needed to get the signal from the sensor out to monitoring apparatus. Second, the signal coupling must be mechanically robust to minimize wear. Third, the signal must be shielded from the effects of noise created by the rotating carrier. Fourth, exposure (both for contacts and the sensor) to the chemically corrosive slurry must be minimized. Finally, any modifications made to the carrier should be easily retrofitted to an existing Westech polisher to minimize changes to other parts of the system such as the robot arm.

Thus there remains a need for rotary signal coupling for use in chemical mechanical polishing endpoint detection that solves the above-listed problems and is suitable for use in a Westech polisher.

SUMMARY OF THE INVENTION

It is therefore an object of the present invention to provide a rotary means of signal coupling to get the signal from the sensor out to the endpoint monitoring apparatus.

It is a further object to provide a signal coupling which is mechanically robust to minimize wear.

It is another object to shield the signal from the effects of noise created by the rotating carrier.

It is yet another object to minimize exposure for the signal coupling sections to the chemically corrosive slurry.

It is yet a further object that any modifications made to the carrier should be easily retrofitted to an existing Westech polisher to minimize changes to other parts of the system.

In accordance with the above listed and other objects, an apparatus for rotary signal coupling in-situ monitoring of a chemical-mechanical polishing process by a polisher is provided with a sensor fixed to a rotatable wafer carrier for creating a signal responsive to the chemical mechanical polishing process, a bottom half of a rotary transformer coupled to the sensor for receiving the signal, the bottom half fixed to a rotating portion of the polisher, a top half of the rotary transformer coupled to the bottom half of the rotary transformer, the top half fixed to a stationary portion of the polisher, and signal transfer means coupled to the top half for transferring the signal to a monitoring means.

BRIEF DESCRIPTION OF THE DRAWINGS

These and other features, aspects, and advantages will be more readily apparent and better understood from the following detailed description of the invention, in which.

DESCRIPTION OF THE PREFERRED EMBODIMENTS

Figure 1:
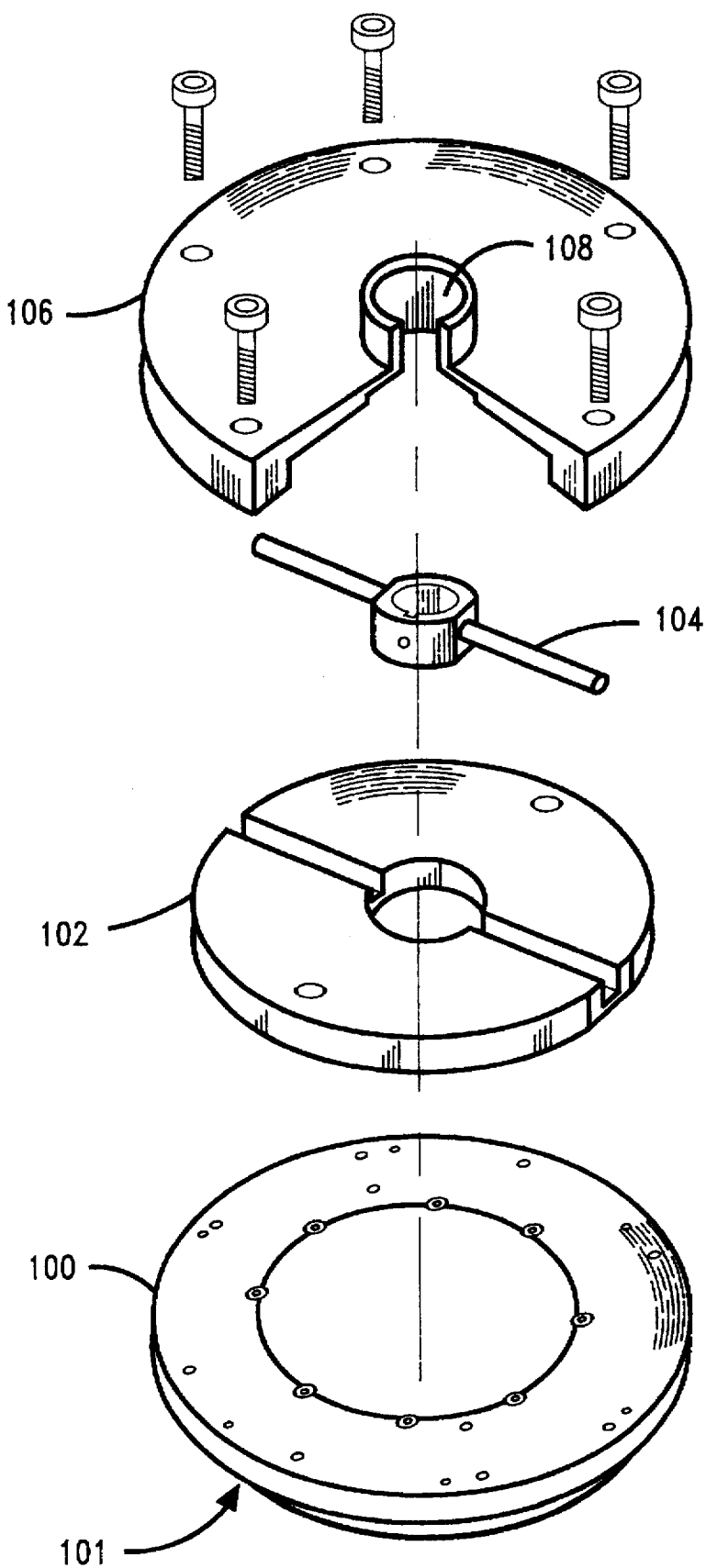
FIG. 1 is an exploded view of the prior art Westech wafer carrier assembly.
Figure 2:
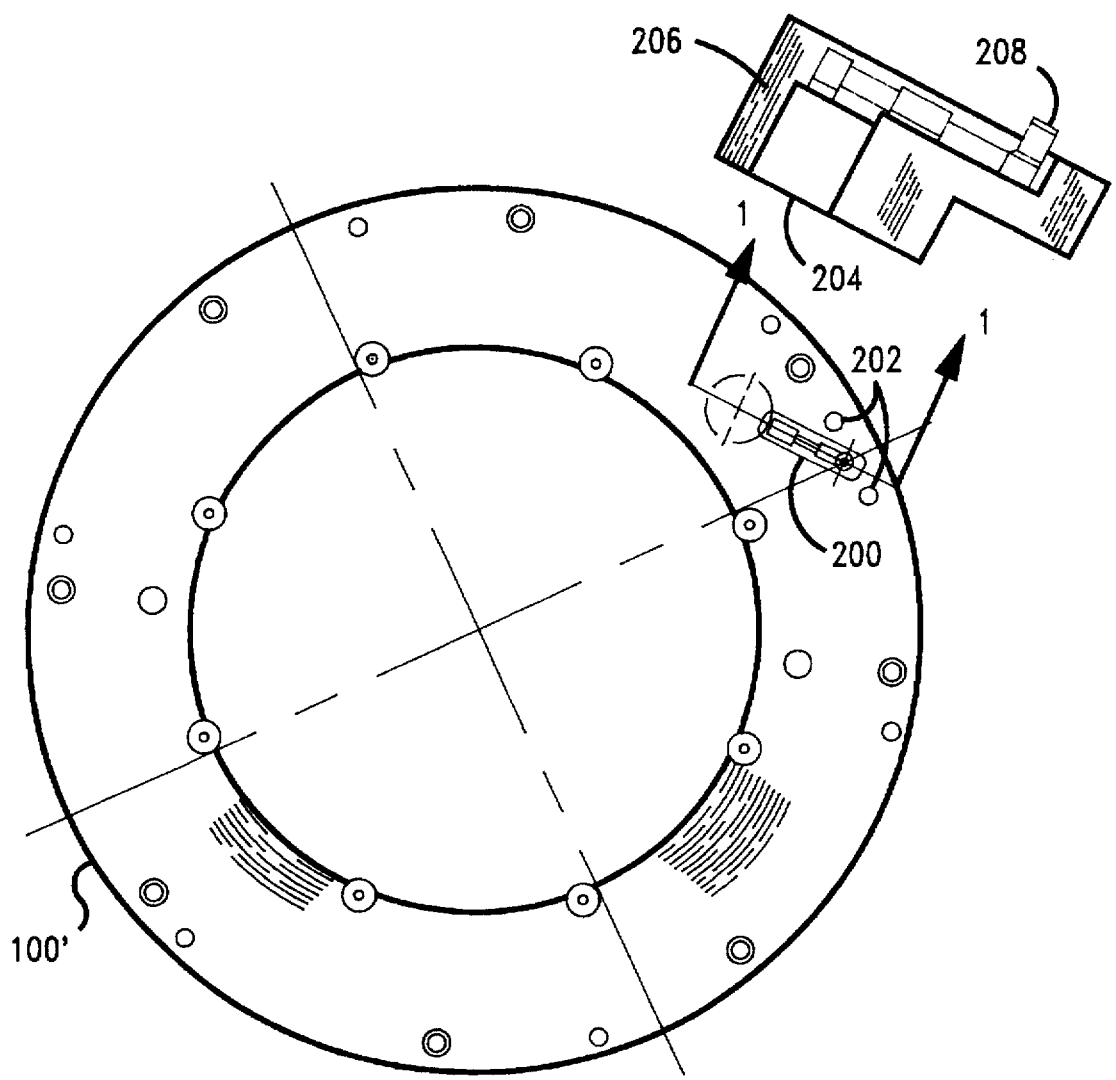
FIG. 2a shows the modified bottom plate.
FIG. 2b shows a cross section of the sensor from FIG. 2a taken along line 1—1.

Referring now to the drawings and more particularly to FIG. 2a, the top side of the modified bottom plate 100' of the wafer carrier is shown. Sensor assembly 200 is embedded in plate 100' so that the bottom of sensor assembly 200 (on the bottom of plate 100') will be proximate the back side of the wafer during polishing. The wafer backside will be separated from the sensor bottom by an insert pad as explained in the Background Section above. On each side of sensor assembly 200 is an optional guide post hole 202. Guide post holes 202 make alignment easier during assembly and prevent mechanical damage when the insert pad is changed.

FIG. 2b shows a cross-section of a preferred sensor 200 along line 1—1 of FIG. 2a. Sensor assembly 200 is made of a sensor head 204 connected to connector 208, both embedded in epoxy 206. Epoxy 206 is a type that is preferably very hard and water resistant, and provides mechanical strength and allows sensor 200 to be easily embedded in plate 100'. In operation, sensor head 204 is exposed on the bottom side of plate 100', and connector 208 is exposed on the top side of plate 100'. Connector 208 may be coaxial as shown in FIG. 2a, or inductive to provide a contactless connection, or other conventional connection means. Generally, the connection should be as resistant to the corrosive slurry as possible.

In the preferred embodiment, sensor head 204 encloses a circuit made of a capacitor and an inductor. The sensor circuit is used to create an alternating electromagnetic field passing through a conductive film on the wafer. During chemical mechanical polishing of the film, sensor head 204 is used to monitor the change in the film thickness, and can very accurately indicate when the polishing endpoint has been reached. Details of how the sensor circuit operates are described in copending application Ser. No. 08/419,206. Note however that other sensor types may be substituted, with differing shape, size, and monitoring methodology, but they are not the preferred embodiment.

Figure 3:
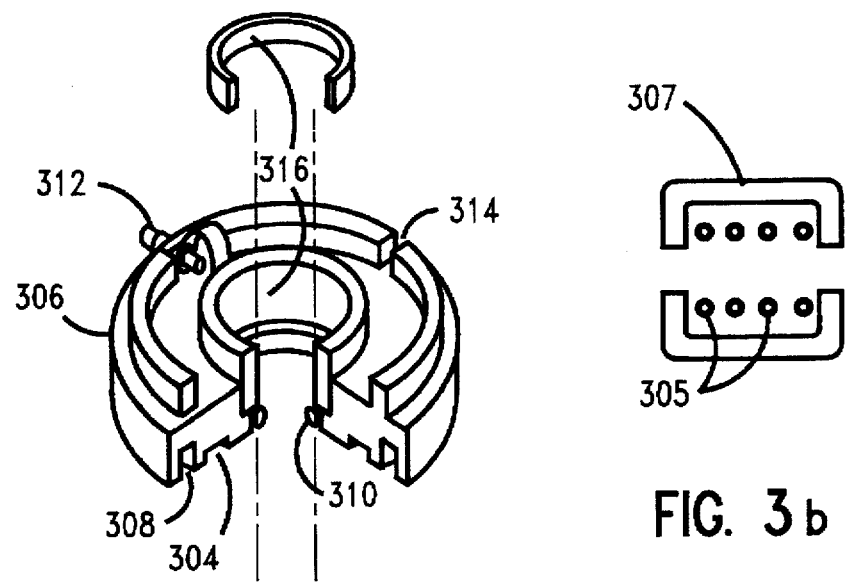
FIG. 3a shows an exploded view of the redesigned carrier top.
FIG. 3b shows a cross-section of a transformer.
Figure 3:
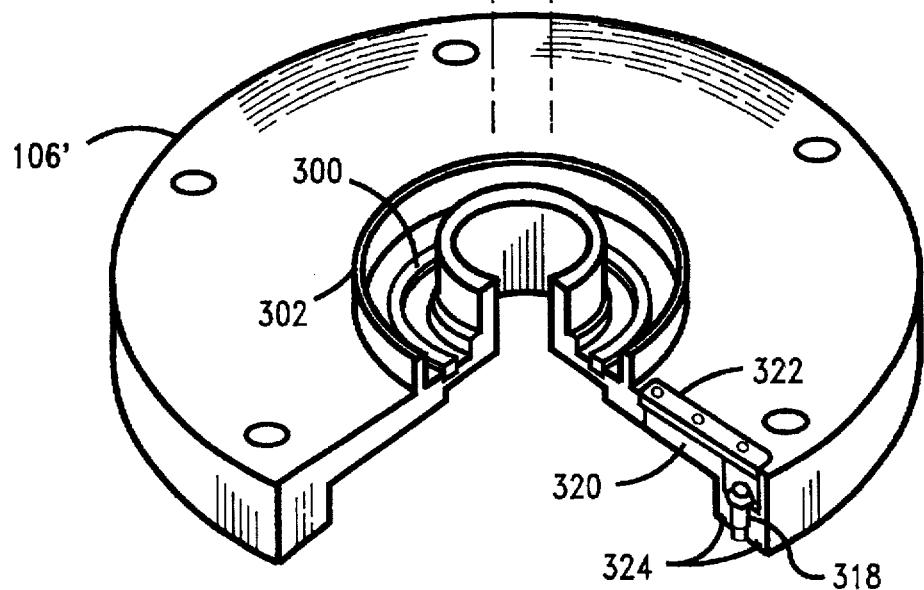

FIG. 3a shows an exploded view of the redesigned carrier top 106', partially cut away. Connector 318 is the mate to connector 208 of FIG. 2. Sensor 200 is coupled to a bottom half 300 of a rotary transformer by connectors 208, 318, and a wire 320 which may be covered by cutout cover 322 made of a material that is inert with respect to the slurry. Note that wire 320 may be embedded in carrier top 106' and the need for cover 322 eliminated. Guide post pins 324 fit in guide post holes 202 on bottom plate 100' (shown in FIG. 2). Bottom plate 100' is frequently removed and reassembled for insert pad changes, and guide post pins 324 allow for easy assembly as well as protect connector 318 from accidental mechanical damage, as previously stated.

Bottom half 300 of the transformer is fixed to and preferably embedded in cutouts within carrier top 106', surrounded by at least one slurry shield wall 302. Note that extra walls may be added to provide a further barrier against slurry contacting transformer half 300. A top half 304 of the rotary transformer is fixed to and preferably embedded in the bottom side of carrier top cover 306 and surrounded by a groove 308 which fits over wall 302 when the transformer halves are assembled.

As shown, rotary transformer halves 300, 304 are fixed to carrier top 106' and carrier top cover 306, respectively. In order to further avoid exposure to slurry and water which is inevitable in manufacturing, the transformer halves could be located higher up in the polisher, with a longer connection to sensor 200. Bottom half 300 thus can be fixed to any rotating portion of the robot arm, and top half 304 fixed to a stationary portion of the polisher proximate bottom half 300.

Each half 300,304 of the rotary transformer is made of coils 305 inside a ferrite core U-type enclosure 307 as shown in FIG. 3b. Cores 307 are specially manufactured by Elna Ferrite of Saugerties, N.Y. from 4C4/4C6 material. Coils 305 and cores 307 are enclosed in plastic and potted to prevent moisture from entering. The ferrite serves several purposes. First, it shields the signal from leaking out which can be a serious problem in an environment where many of the parts are metal and are constantly rotating against one another. Second, the coupling between the transformer halves is contactless and eliminates mechanical wear, thus extending operating life and minimizing contamination. Third, multiple cores can constitute each transformer, with coils in each core simultaneously carrying a signal from a single sensor, thus enabling multiple sensors to be used.

During polishing, carrier top 106' as well as bottom half 300 of the transformer rotate, while carrier top cover 306 and top half 304 of the transformer are stationary. A ball bearing 310 ensures smooth rotational coupling between the respective covers 106', 306 and transformer halves 300, 304, and is held in place by threaded plastic cylinders 316. A suitable bearing is type KAA 15XL0 or NAA 15XL0 from Kaydon Bearing, but others made of materials such as stainless steel or ceramic could be used. A connector 312, the mate of connector 208, is coupled to top half 304 of the rotary transformer and provides for signal transmission out to a measurement instrument.

Figure 4:
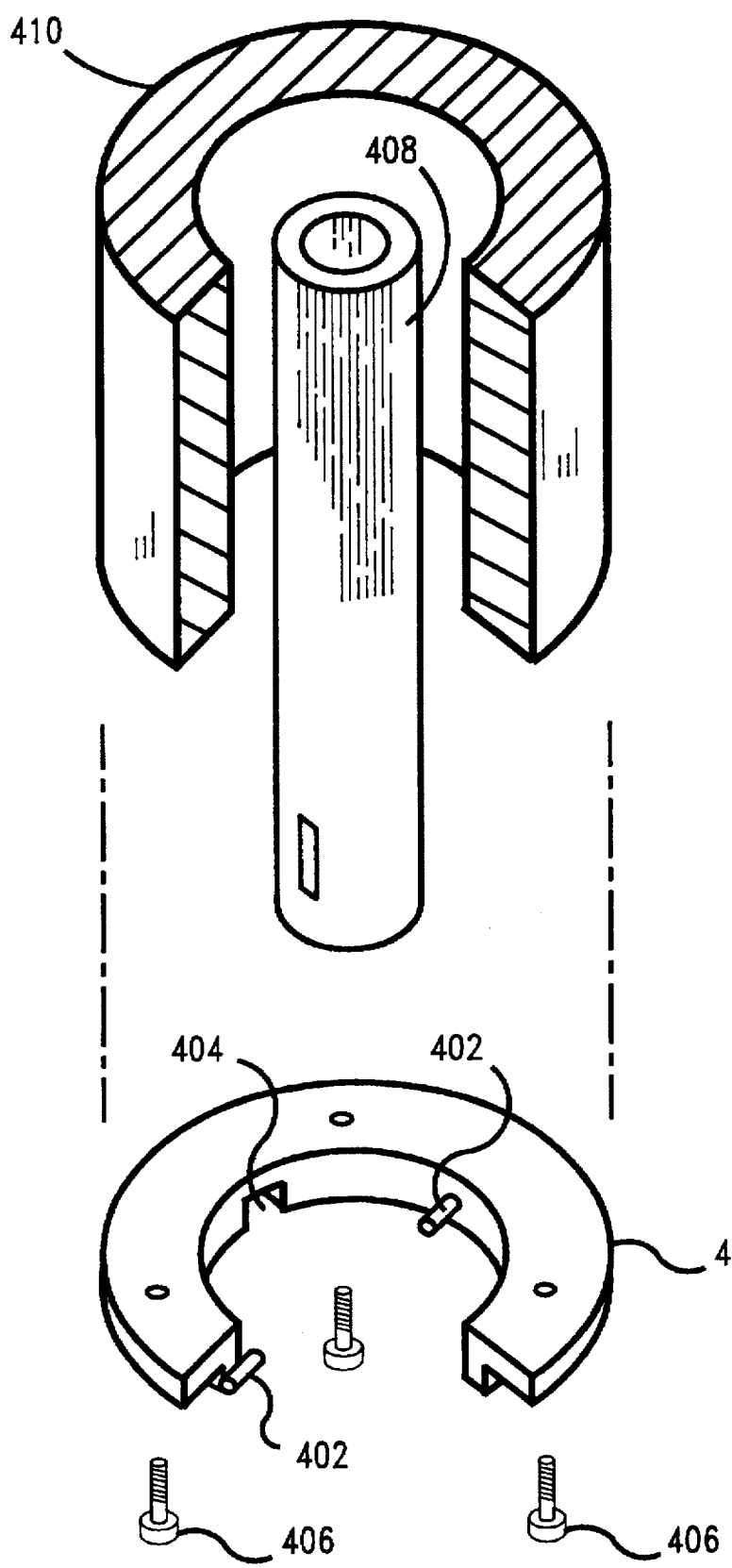
FIG. 4 shows the adapter ring connecting to the robot arm of the polisher.

Slots 314 (only one is shown due to the cutaway portion) in carrier top cover 306 provide for attachment of an adapter ring 400 shown in FIG. 4. Pins 402 fit into slots 314, and adapter ring 400 is attached to unmodified stationary robot arm portion 410 of the polisher by screws 406. Adapter ring may have a slot 404 which fits over connector 312. Unmodified robot arm portion 408 passes through the center opening of adapter ring 400 to engage t-bar 104 for rotational movement. Robot arm portion 408 is hollow and is the means through which a vacuum is generated to hold the wafer carrier.

Figure 5:
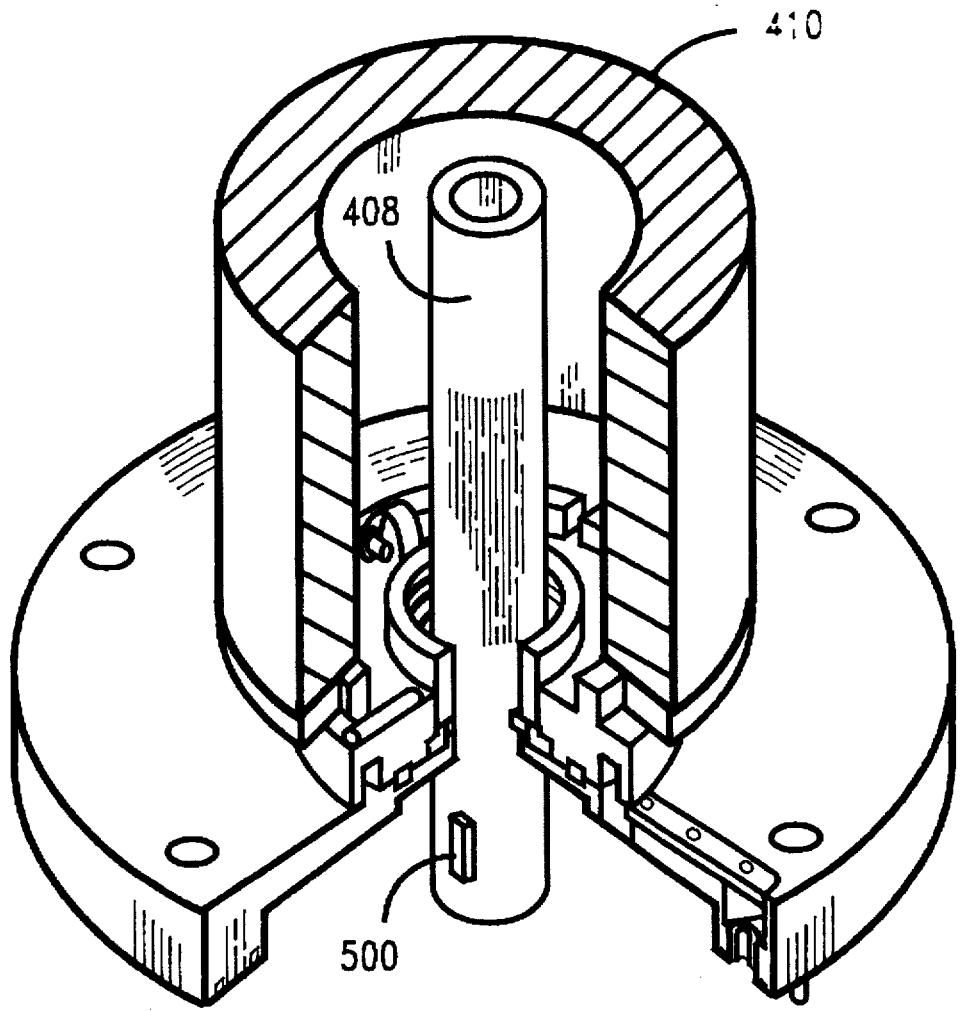
FIG. 5 shows the assembled redesigned carrier top connected to the robot arm of the polisher.
Figure 5:
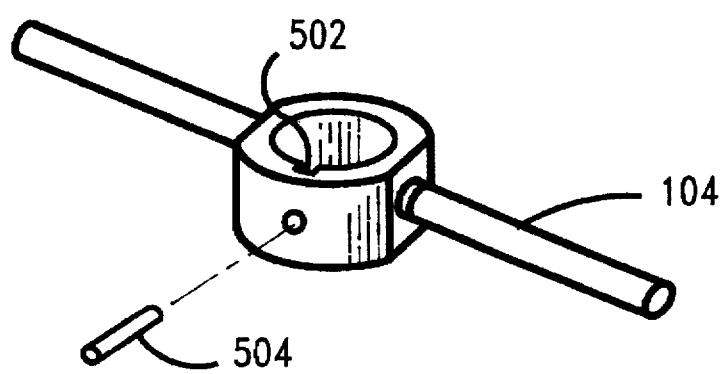
Figure 6:
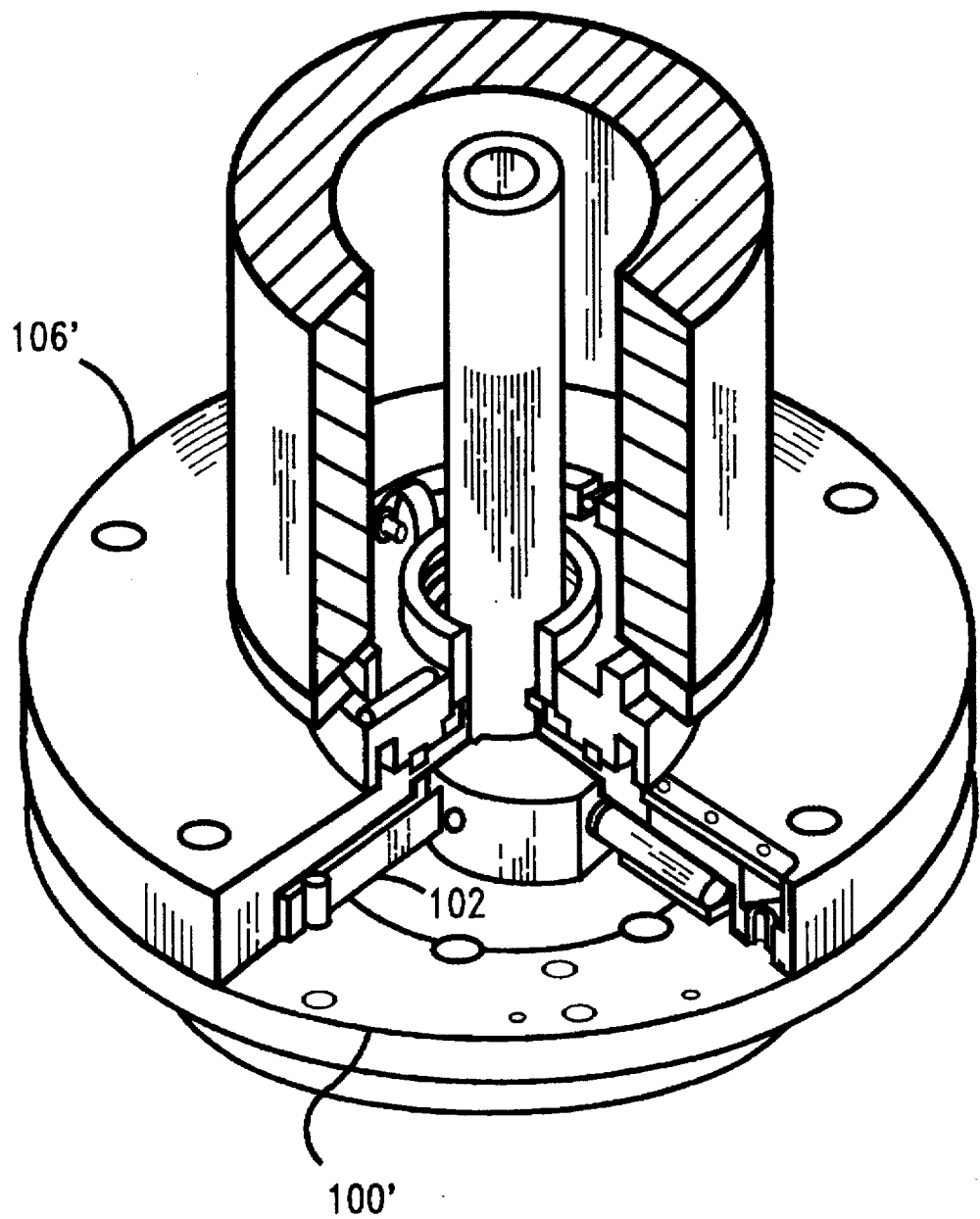
FIG. 6 shows the assembled redesigned wafer carrier; all in accordance with the present invention.

FIG. 5 shows the carrier top and carrier top cover assembly attached to the polisher. Robot arm portion 408 engages t-bar 104 by a key 500 which fits into slot 502 of t-bar 104 and is held by two opposing set screws 504 (only one is shown in FIG. 5). FIG. 6 shows the assembly of FIG. 5 with carrier drive ring 102 and bottom plate 100' added.

This design was easily retrofitted to an existing Westech polishing tool. Sensor assembly 200 was added to standard bottom plate 100; carrier top 106' with carrier top cover 306 and rotary transformer (300, 304) replaced original carrier top 106, and adapter ring. 400 was interposed between carrier top cover 306 and stationary robot arm portion 410. No changes were required for carrier drive ring 102, t-bar 104, stationary robot arm portion 410, and robot arm portion 408. The same total height was maintained in the new design so that no robot arm or polishing table adjustments were necessary. In summary, a rotary means of signal coupling has been provided for real time in-situ monitoring of a chemical mechanical planarization process, particularly with a Westech polisher. The signal coupling described is mechanically robust to minimize wear, and also minimizes exposure to the chemically corrosive slurry. The signal is also shielded from the effects of noise created by the rotating carrier. The signal coupling provided requires minimal modifications to an existing Westech polisher, and thus is extremely cost effective and easy to manufacture.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. An apparatus for rotary signal coupling in-situ monitoring of a chemical-mechanical polishing process by a polisher, comprising:

a sensor fixed to a rotatable wafer carrier for creating a signal responsive to the chemical mechanical polishing process;

a bottom half of a rotary transformer coupled to the sensor for receiving the signal, the bottom half fixed to a rotating portion of the polisher;

a top half of the rotary transformer coupled to the bottom half of the rotary transformer, the top half fixed to a stationary portion of the polisher; and signal transfer means coupled to the top half for transferring the signal to a monitoring means.

2. The apparatus of claim 1 wherein the bottom half of the rotary transformer is fixed to the rotatable wafer carrier.

3. The apparatus of claim 2 wherein the top half of the rotary transformer is fixed to a stationary carrier top cover.

4. The apparatus of claim 1 wherein the bottom half of the rotary transformer is fixed to a rotatable portion of a robot arm rotating the wafer carrier.

5. The apparatus of claim 4 wherein the top half of the rotary transformer is fixed to a stationary portion of the robot arm.

6. The apparatus of claim 1 wherein each half of the rotary transformer comprises a coil inside a ferrite enclosure.

7. The apparatus of claim 1 wherein each half of the rotary transformer comprises a plurality of coils, each coil inside a separate ferrite enclosure.

8. The apparatus of claim 1 further comprising a ball bearing in between the bottom and top halves of the rotary transformer.

9. The apparatus of claim 1 wherein the bottom half of the rotary transformer is coupled to the sensor by coupling means including a coaxial connector.

10. The apparatus of claim 1 wherein the bottom half of the rotary transformer is coupled to the sensor by coupling means including an inductive connector.

11. The apparatus of claim 1 wherein the signal transfer means comprises coupling means including a coaxial connector.

12. The apparatus of claim 1 wherein the signal transfer means comprises coupling means including an inductive connector.

13. The apparatus of claim 1 wherein the rotatable wafer carrier further comprises:

a bottom plate for holding a semiconductor wafer, the sensor embedded in the bottom plate;

a carrier drive ring coupled to the bottom plate; a t-bar coupled to the carrier drive ring; and a carrier top coupled to the carrier drive ring.

14. The apparatus of claim 13 wherein the rotatable wafer carrier further comprises means for keeping slurry away from the rotary transformer.

15. The apparatus of claim 3 wherein the stationary carrier top cover further comprises means for rotatably coupling with the rotatable wafer carrier.

16. The apparatus of claim 15 wherein the means for rotatably coupling with the rotatable wafer carrier comprises:

means for aligning the stationary carrier top with the rotatable wafer carrier; and a ball bearing.

17. The apparatus of claim 3 further comprising an adapter ring coupled to the stationary carrier top cover, the adapter ring adapted for connection to a robot arm of the polisher.

18. A method for in-situ monitoring of chemical-mechanical polishing a semiconductor wafer fixed to a rotating wafer carrier, comprising:

creating a signal responsive to chemical mechanical polishing the wafer;

sensing the signal with a sensor fixed to the rotating wafer carrier;

coupling the signal from the sensor to a bottom half of a rotary transformer fixed to a rotatable portion of the polisher;

coupling the signal from the bottom half of the rotary transformer to a top half of the rotary transformer fixed to a stationary portion of the polisher; and transferring the signal from the top half to a monitoring means.

19. The method of claim 18 wherein the bottom half of the rotary transformer is fixed to the rotating wafer carrier.

20. The method of claim 19 wherein the top half of the rotary transformer is fixed to a stationary carrier top cover.

21. The method of claim 18 wherein the bottom half of the rotary transformer is fixed to a rotatable portion of a robot arm rotating the wafer carrier.

22. The method of claim 21 wherein the top half of the rotary transformer is fixed to a stationary portion of the robot arm.

* * * * *

UNITED STATES PATENT AND TRADEMARK OFFICE
CERTIFICATE OF CORRECTION

PATENT NO. : 5,663,637
DATED : September 2, 1997
INVENTOR(S) : Leping Li; Steven George Barbee; Gary Richard Doyle; Arnold Halperin; Kevin L. Holland; Francis Walter Kazak; Robert B. Lipori; Anne Elizabeth McGuire; Rock Nadeau; and William Joseph Surovic It is certified that error appears in the above-indentified patent and that said Letters Patent is hereby corrected as shown below:

In Claim 18, Column 6, line 16 after "wafer carrier" please insert --of a polisher--.

Signed and Sealed this

Twenty-eighth Day of April, 1998

Attest:

BRUCE LEHMAN

Attesting Officer

Commissioner of Patents and Trademarks